United States Patent
Takatsuka et al.

(10) Patent No.: US 10,291,033 B2
(45) Date of Patent: May 14, 2019

(54) POWER STORAGE MANAGEMENT SYSTEM, POWER STORAGE APPARATUS AND POWER STORAGE MANAGEMENT METHOD

(71) Applicant: OMRON Corporation, Kyoto (JP)

(72) Inventors: Hiromasa Takatsuka, Nara (JP); Kazuki Kasai, Kizugawa (JP); Fumiji Aita, Nara (JP); Hiroshi Imai, Nara (JP)

(73) Assignee: OMRON Corporation, Kyoto (JP)

( * ) Notice: Subject to any disclaimer, the term of this patent is extended or adjusted under 35 U.S.C. 154(b) by 356 days.

(21) Appl. No.: 15/381,134

(22) Filed: Dec. 16, 2016

(65) Prior Publication Data
US 2017/0250536 A1 Aug. 31, 2017

(30) Foreign Application Priority Data
Feb. 25, 2016 (JP) .................. 2016-034547

(51) Int. Cl.
*H02J 3/00* (2006.01)
*H02J 3/38* (2006.01)
(Continued)

(52) U.S. Cl.
CPC ............. *H02J 3/383* (2013.01); *G01R 1/00* (2013.01); *H02J 7/0068* (2013.01);
(Continued)

(58) Field of Classification Search
CPC ........ G01R 1/00; H02J 13/0013; H02J 3/383; H02J 7/0068; H02J 13/0006; H02J 3/32;
(Continued)

(56) References Cited

U.S. PATENT DOCUMENTS

2015/0066231 A1* 3/2015 Clifton ................ G05F 1/66
700/296
2015/0372518 A1* 12/2015 Toya ................ G06F 3/0488
320/106

FOREIGN PATENT DOCUMENTS

JP 2013-084199 5/2013
JP 2013-169137 8/2013

* cited by examiner

*Primary Examiner* — Rexford N Barnie
*Assistant Examiner* — Toan T Vu
(74) *Attorney, Agent, or Firm* — JCIPRNET

(57) ABSTRACT

A power storage management system, a power storage apparatus, a power storage management method are provided. The power storage management system includes a receiver part, a sender identifying part, a memory part and a deterioration degree estimating part. The sender identifying part identifies an external apparatus that transmitted a control signal received by the receiver part. The memory part stores apparatus information related to the external apparatus identified by the sender identifying part and power storage status information related to the status change of the power storage apparatus caused by charging or discharging performed according to the control signal transmitted from the external apparatus. The deterioration degree estimating part estimates the deterioration degree of the power storage apparatus to which a charge/discharge control is performed according to the control signal transmitted from the sender apparatus based on the apparatus information and the power storage status information.

11 Claims, 11 Drawing Sheets

(51) Int. Cl.
*H02J 7/00* (2006.01)
*H02J 13/00* (2006.01)
*G01R 1/00* (2006.01)
*H02S 10/00* (2014.01)
*H02S 50/00* (2014.01)
*H02S 40/38* (2014.01)
H02J 3/32 (2006.01)
H02J 7/35 (2006.01)

(52) U.S. Cl.
CPC .......... *H02J 13/0013* (2013.01); *H02S 10/00* (2013.01); *H02S 40/38* (2014.12); *H02S 50/00* (2013.01); *H01M 2220/10* (2013.01); *H02J 3/32* (2013.01); *H02J 7/35* (2013.01); *H02J 13/0006* (2013.01); *Y02E 10/563* (2013.01); *Y02E 10/566* (2013.01); *Y02E 40/72* (2013.01); *Y02E 60/722* (2013.01); *Y02E 60/74* (2013.01); *Y02P 90/50* (2015.11); *Y04S 10/123* (2013.01); *Y04S 10/14* (2013.01); *Y04S 10/30* (2013.01)

(58) Field of Classification Search
CPC .. H02J 7/35; H02S 10/00; H02S 40/38; H02S 50/00; H01M 2220/10; Y02E 10/563; Y02E 10/566; Y02E 40/72; Y02E 60/722; Y02E 60/74; Y02P 90/50; Y04S 10/123; Y04S 10/14; Y04S 10/30
USPC .......................................................... 307/26
See application file for complete search history.

| Controlling apparatus ID | Controlled apparatus ID | Command | Parameters |
|---|---|---|---|
| ID0001 | ID0004 | ChargingCurrent | 1[A], 100[minutes] |
| ID0015 | ID0004 | DischargingCurrent | 4[A], 200[minutes] |
| ID0040 | ID0004 | ChargingCurrent | 5[A], 50[minutes] |
| ID0156 | ID0004 | DischargingCurrent | 10[A], 300[minutes] |
| ... | ... | ... | ... |

FIG. 3

| Controlling apparatus ID | User | Command | Parameters | Billing amount |
|---|---|---|---|---|
| ID0001 | Consumer B | ChargingCurrent | 1[A], 100[minutes] | — |
| ID0015 | Consumer C | DischargingCurrent | 4[A], 200[minutes] | ¥5,000 |
| ID0040 | Consumer D | ChargingCurrent | 5[A], 50[minutes] | — |
| ID0015 | Consumer D | DischargingCurrent | 10[A], 300[minutes] | ¥15,000 |
| . . . | | . . . | . . . | |

FIG. 7

POWER STORAGE MANAGEMENT SYSTEM, POWER STORAGE APPARATUS AND POWER STORAGE MANAGEMENT METHOD

CROSS-REFERENCE TO RELATED APPLICATION

This application claims the priority benefit of Japan application serial no. 2016-034547, filed on Feb. 25, 2016. The entirety of the above-mentioned patent application is hereby incorporated by reference herein and made a part of this specification.

BACKGROUND OF THE INVENTION

Field of the Invention

The disclosure relates to a power storage management system, a power storage apparatus and a power storage management method that manages deterioration information of the power storage apparatus used by multiple consumers connected to a power distribution network supplying electric power.

Description of Related Art

In recent years, power storage apparatuses that store electric power are deployed in a power distribution network that supplies electric power to a plurality of consumers. There exists a proposal to operate such a plurality of power storage apparatuses deployed in a power distribution network as a virtual large-scale power storage apparatus so that consumers other than the owners can use them.

For example, Patent Document 1 discloses a power distribution network in which users who do not own a power storage apparatus can use a shared power storage apparatus connected in a smart grid network.

PRIOR ART LITERATURE

Patent Literature

Patent Document 1: Japanese Patent Laid-Open No. 2013-169137.
Patent Document 2: Japanese Patent Laid-Open No. 2013-084199.

However, the abovementioned conventional electricity network system has the following issue. The systems disclosed in the above Patent Documents allows a plurality of users connected to a smart grid network to use a shared power storage apparatus, but some users may use the shared power storage apparatus in a manner such as rapid charging and large-capacity discharging that accelerates deterioration of the power storage apparatus.

In this case, because it is not possible to grasp users, usage conditions, etc. that accelerate deterioration of the shared power storage apparatus, the owner of the power storage apparatus shared in the power distribution network is difficult to take measures such as restricting usage from the users who use the shared power storage apparatus in a manner which accelerates deterioration.

SUMMARY OF THE DISCLOSURE

The disclosure provides a power storage management system, a power storage apparatus and a power storage management method that is capable of managing the deterioration status of a power storage apparatus shared in a power distribution network by identifying a user or an apparatus that uses the power storage apparatus in a manner that accelerates deterioration of the power storage apparatus.

A power storage management system according to an embodiment of the disclosure is a power storage management system that manages a deterioration status of a power storage apparatus that is used by a plurality of consumers connected to a power distribution network supplying electric power, and includes a receiver part, a sender identifying part, a memory part and a deterioration degree estimating part. The receiver part receives a control signal that gives a charge/discharge instruction to the power storage apparatus. The sender identifying part identifies a sender of the control signal received by the receiver part. The memory part stores apparatus information related to a sender apparatus identified by the sender identifying part and power storage status information related to a status change of the power storage apparatus due to the charging or discharging performed according to the control signal transmitted from the sender apparatus. The deterioration degree estimating part estimates the deterioration degree of the power storage apparatus to which a charge/discharge control is performed according to the control signal transmitted from the sender apparatus based on the apparatus information and the power storage status information.

Here, to manage the deterioration status of the power storage apparatus shared by a plurality of consumers connected to the power distribution network supplying electric power, the control signal which gives the charge/discharge instruction transmitted to the power storage apparatus is received. Then, the deterioration degree of the power storage apparatus which is resulted from charging or discharging according to the control signal is estimated by identifying the sender apparatus which transmits the control signal and detecting the status change of the power storage apparatus caused by charging or discharging operated according to the control message.

Here, the power storage apparatus to which the deterioration degree is estimated may be a power storage apparatus owned by at least one consumer among a plurality of consumers connected to the power distribution network, or a power storage apparatus owned by each of a plurality of consumers. The sender apparatus may be a power storage apparatus owned by the same consumer or a power storage apparatus owned by another consumer, or an apparatus of a various type other than the power storage apparatus, owned by another consumer.

The status change of the power storage apparatus caused by charging or discharging includes, for example, a change in the full charge capacity, a change in the internal resistance, a temperature rise, etc. The estimation of the deterioration degree by the deterioration degree estimating part may be performed in real time when receiving the control signal or performed based on the usage history information previously stored in the memory part.

Thereby, if the deterioration degree resulted from the charging or discharging of the power storage apparatus according to the control signal transmitted from a specific sender apparatus (or user) is estimated to be great, the sender apparatus (or user) which transmitted the control signal can be identified. As a result, it is possible to identify the sender apparatus (or user) which uses the power storage apparatus shared in the power distribution network in a deterioration-accelerating manner, and to take measures such as restricting the acceptance of the control signal from the sender apparatus (or user) which uses the power storage in the deterioration-accelerating manner. Accordingly, in the case where a power storage apparatus is shared in the power distribution network, it is possible to prevent a decline in the life of the power storage apparatus by restricting the usage from the apparatus or user which uses the power storage in a deterioration-accelerating manner.

In a power storage management system according to an embodiment of the disclosure, the memory part further stores causal relationship information that correlates the sender apparatus with the deterioration degree of the power storage apparatus due to the charging or discharging performed according to the control signal transmitted from the sender apparatus based on the deterioration degree of the power storage apparatus estimated by the deterioration degree estimating part and the apparatus information identified by the sender identifying part.

Here, the causal relationship information correlating the sender apparatus with the deterioration degree of the power storage apparatus due to the charging or discharging performed according to the control signal transmitted from the sender apparatus is stored by using the deterioration degree estimated by the deterioration degree estimating part and the apparatus information identified by the sender identifying part. Thereby, in the case where the power storage apparatus is shared in the power distribution network, it is possible to prevent a decline in the life of the power storage apparatus by restricting the usage from an apparatus or a user which uses the power storage apparatus in a deterioration-accelerating manner by using the causal relationship information correlating the sender apparatus with the deterioration degree of the power storage apparatus due to the charging or discharging performed according to the control signal transmitted from the sender apparatus.

In a power storage management system according to an embodiment of the disclosure, the power storage status information includes information related to at least one of the full charge capacity, the internal resistance and the temperature of the power storage apparatus. Here, the information related to at least one of the full charge capacity, the internal resistance and the temperature of the power storage apparatus is used as the power storage status information related to the status of the power storage apparatus which is changed by the charging or discharging performed according to the control signal. Thereby, the deterioration degree of the power storage apparatus due to the charging or discharging performed according to the control signal can be detected by using indicators such as the change in the full charge capacity, the change in the internal resistance and the change in the temperature.

In a power storage management system according to an embodiment of the disclosure, the power storage status information is obtained by using at least one of a current sensor, a voltage sensor and a temperature sensor disposed in the power storage apparatus. Here, the change in the full charge capacity, the change in the internal resistance and the change in the temperature used for estimating the above-mentioned deterioration degree of the power storage apparatus are measured by the current sensor, the voltage sensor and the temperature sensor. Thereby, it is possible to easily estimate the deterioration degree of the power storage apparatus.

A power storage management system according to an embodiment of the disclosure further includes a charge/discharge controlling part that performs a charge/discharge control of the power storage apparatus based on the control signal. The charge/discharge controlling part determines whether to perform the charge/discharge control according to the control signal received from the sender apparatus corresponding to the estimation result based on the causal relationship information stored in the memory part.

Here, the charging or discharging according to the control signal received from the sender apparatus is not performed if it is determined that the deterioration degree of the power storage apparatus due to the charging or discharging performed according to the received control signal exceeds the normal deterioration degree based on the causal relationship information stored in the memory part. Thereby, it is possible to restrict the usage from an apparatus or a user which uses the power storage in a manner such as rapid charging and large-capacity discharging which accelerates deterioration. As a result, it is possible to prevent a decline in the life of the power storage apparatus by avoiding the deterioration of the power storage apparatus shared in the power distribution network being accelerated by a specific user.

A power storage management system according to an embodiment of the disclosure further includes a usage restriction target specifying part that specifies at least one of information related to the control signal and the owner of the sender apparatus received from the sender apparatus that is determined not to perform the charge/discharge control by the charge/discharge controlling part.

Here, as the sender of the control signal restricted as a charge/discharge control accelerating deterioration by the deterioration degree estimating part, the information related to the owner (user) of the sender apparatus and the information related to the control signal are specified. Thereby, it is possible to take measures such as a usage restriction by specifying the control signal which accelerates deterioration of the power storage apparatus shared in the power distribution network and the user which sends the control signal.

A power storage management system according to an embodiment of the disclosure further includes a display controlling part that displays at least one of the estimation result from the deterioration degree estimating part and the causal relationship information on a display part. Here, the display controlling part displays at least one of the estimation result from the deterioration degree estimating part and the causal relationship information on the display part. Thereby, the owner of the power storage apparatus shared in the power distribution network can recognize a user who uses the power storage apparatus in a deterioration-accelerating manner and a usage which accelerates deterioration by referring to the deterioration estimation result and the causal relationship information displayed on the display part.

A power storage management system according to an embodiment of the disclosure further includes a billing setting part that sets the user of the sender apparatus who transmitted the control signal as a billing target based on the causal relationship information. Here, based on the causal relationship information, the user who uses the power storage apparatus in a deterioration-accelerating manner is billed according to the degree of deterioration, for example. Thereby, the owner of the power storage apparatus shared in the power distribution network can recover the damage caused by acceleration of deterioration by billing.

A power storage apparatus according to an embodiment of the disclosure includes the power storage management system and cells that are charged or discharged according to a charge/discharge instruction. Here, the power storage management system is mounted on the power storage apparatus which includes the cells. Thereby, in the case where the power storage apparatus is shared in the power distribution network, it is possible to prevent decline in the life of the power storage apparatus by making the power storage apparatus itself perform the abovementioned power storage management which restricts the usage from an apparatus or a user which uses the power storage apparatus in a deterioration-accelerating manner.

A power storage management method according to an embodiment of the disclosure is a power storage management method that manages the deterioration status of the power storage apparatus used by a plurality of consumers connected to the power distribution network supplying electric power, and includes a receiving step, a sender identification step and a deterioration degree estimation step. The receiving step receives the control signal which instructs charging or discharging of the power storage apparatus. The sender identification step specifies the sender apparatus which transmits the control signal received in the receiving step. The deterioration degree estimation step estimates the deterioration degree of the power storage apparatus to which the charge/discharge control is performed according to the control signal transmitted from the sender apparatus based on the apparatus information related to the sender apparatus specified at the sender identification step and the power storage status information related to the status change of the power storage apparatus caused by the charging or discharging performed according to the control signal transmitted from the sender apparatus.

Here, for managing the deterioration degree of the power storage apparatus shared by a plurality of consumers connected to the power distribution network supplying electric power, the control signal instructing charging or discharging which is transmitted to the power storage apparatus is received. Then, by specifying the sender apparatus which transmitted the control signal and by detecting the status change of the power storage apparatus due to the charging or discharging performed according to the control signal, the deterioration degree of the power storage apparatus resulted from the charging or discharging performed according to the control signal is estimated.

Here, the power storage apparatus estimating the deterioration degree may be a power storage apparatus that is owned by at least one of a plurality of consumers connected to the power distribution network, or a power storage apparatus owned by each of the plurality of consumers owns. Also, the sender apparatus may be a power storage apparatus owned by the sane owner or a power storage apparatus owned by another consumer, or an apparatus of a various type other than a power storage apparatus, owned by another consumer.

The status change of the power storage apparatus caused by charging or discharging includes, for example, a change in the full charge capacity, a change in the internal resistance, a temperature rise, etc. The estimation of the deterioration degree at the deterioration degree estimation step may be performed in real time when receiving the control signal or performed based on the previously stored usage history information.

Thereby, if the deterioration degree resulted from the charging or discharging of the power storage apparatus according to the control signal transmitted from a specific sender apparatus (or user) is estimated to be great, the sender apparatus (or user) which transmitted the control signal can be identified. As a result, it is possible to identify a sender apparatus (or user) which uses the power storage apparatus shared in the power distribution network in a deterioration-accelerating manner, and to take measures such as restricting the acceptance of the control signal from the sender apparatus (or user) which uses the power storage in a deterioration-accelerating manner. Accordingly, in the case where a power storage apparatus is shared in the power distribution network, it is possible to prevent a decline in the life of the power storage apparatus by restricting the usage from an apparatus or a user which uses the power storage in a deterioration-accelerating manner.

A power storage management program according to the disclosure is a power storage management program that manages a deterioration status of a power storage apparatus that is used by a plurality of consumers connected to a power distribution network supplying electric power, and makes a computer execute a power storage management method that includes a receiving step, sender identifying step and a deterioration degree estimating step. The receiving step receives the control signal which instructs charging or discharging of the power storage apparatus. The sender identifying step specifies the sender apparatus which transmits the control signal received in the receiving step. The deterioration degree estimating step estimates the deterioration degree of the power storage apparatus to which the charge/discharge control is performed according to the control signal transmitted from the sender apparatus based on the apparatus information related to the sender apparatus specified in the sender identifying step and the power storage status information related to the status change of the power storage apparatus caused by the charging or discharging performed according to the control signal transmitted from the sender apparatus.

Here, for managing the deterioration degree of the power storage apparatus shared by a plurality of consumers connected to the power distribution network supplying electric power, the control signal instructing charging or discharging which is transmitted to the power storage apparatus is received. Then, by specifying the sender apparatus which transmitted the control signal and by detecting the status change of the power storage apparatus due to the charging or discharging performed according to the control signal, the deterioration degree of the power storage apparatus resulted from the charging or discharging performed according to the control signal is estimated.

Here, the power storage apparatus the deterioration degree of which is estimated may be a power storage apparatus that is owned by at least one of a plurality of consumers connected to the power distribution network, or a power storage apparatus owned by each of the plurality of consumers. Also, the sender apparatus may be a power storage apparatus owned by the sane owner or a power storage apparatus owned by another consumer, or an apparatus of a various type other than a power storage apparatus, owned by another consumer.

The status change of the power storage apparatus caused by charging or discharging includes, for example, a change in the full charge capacity, a change in the internal resistance, a temperature rise, etc. The estimation of the deterioration degree at the deterioration degree estimating step may be performed in real time when receiving the control signal or performed based on the usage history information stored in the memory part.

Thereby, if the deterioration degree resulted from the charging or discharging of the power storage apparatus according to the control signal transmitted from a specific sender apparatus (or user) is estimated to be great, the sender apparatus (or user) which transmitted the control signal can be identified. As a result, it is possible to identify a sender apparatus (or user) which uses the power storage apparatus shared in the power distribution network in a deterioration-accelerating manner, and to take measures such as restricting the acceptance of the control signal from the sender apparatus (or user) which uses the power storage in a deterioration-accelerating manner.

Accordingly, in the case where a power storage apparatus is shared in the power distribution network, it is possible to prevent a decline in the life of the power storage apparatus by restricting the usage from an apparatus or a user which uses the power storage in a deterioration-accelerating manner.

A power storage management system according to the disclosure is capable of managing the deterioration degree of a power storage apparatus by specifying an apparatus or a user which uses the power storage apparatus shared in a power distribution network in a deterioration-accelerating manner.

BRIEF DESCRIPTION OF THE DRAWINGS

FIG. 3 is a diagram illustrating information of the sender apparatus (ID) and instruction contents (command, parameters) included in the charge/discharge control signal received by the receiver part in FIG. 2.

FIG. 7 is a diagram illustrating the ID, the user name, the instruction contents (command, parameters) and the billing amount of the sender apparatuses which use the power storage apparatus in a manner resulting excessive deterioration according to the deterioration degree estimating part of FIG. 2.

DESCRIPTION OF THE EMBODIMENTS

Figure 1:
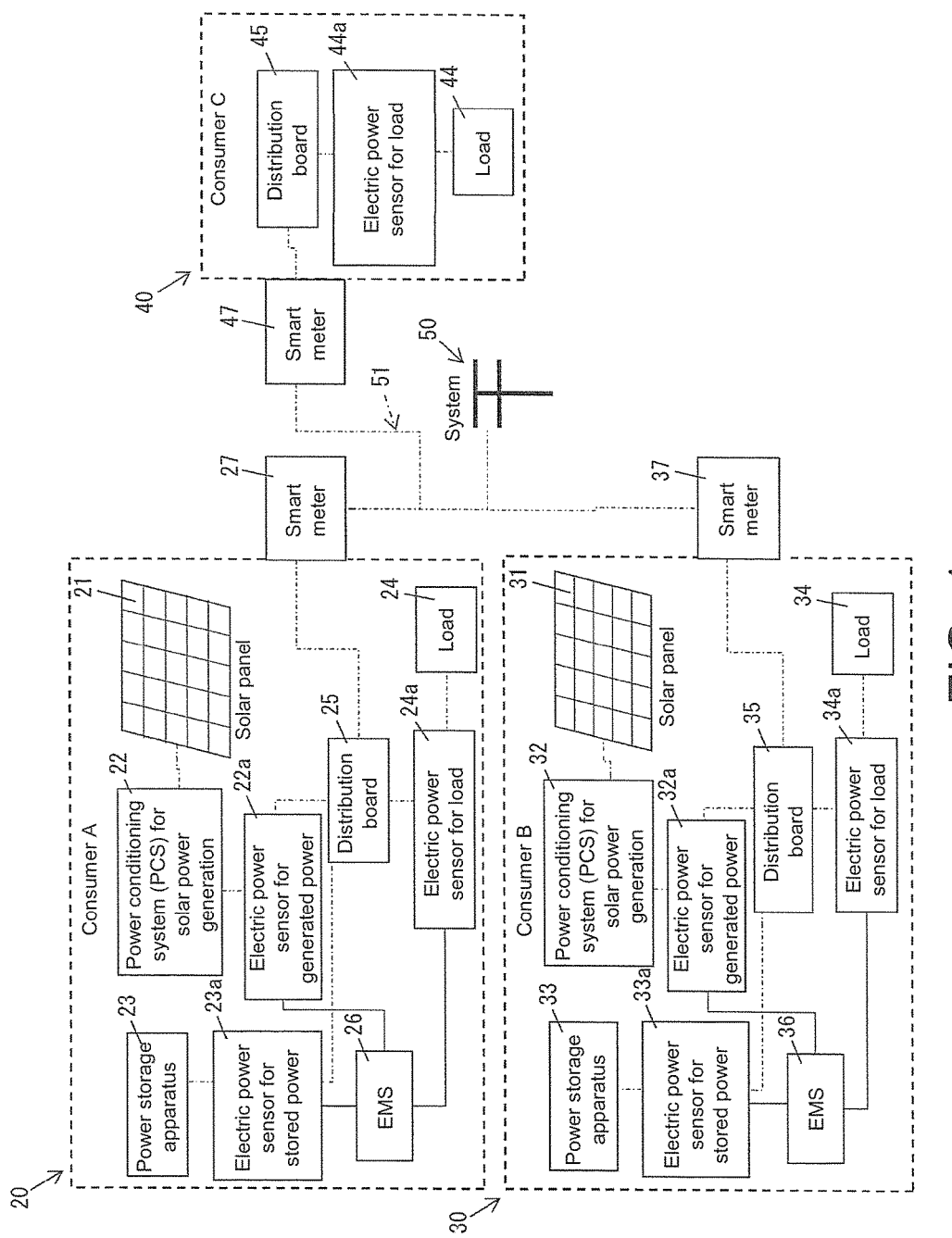
FIG. 1 is a block diagram illustrating a configuration in which a plurality of consumers including a consumer that owns a power storage apparatus including the power storage management system according to an embodiment of the disclosure are connected to a power distribution network.

A power storage management system according to the first embodiment of the disclosure is described using FIGS. 1 to 10. Here, a consumer A 20 that is appeared in the following description owns a power generation apparatus (solar panel 21) and a power storage apparatus 23, and means a consumer that owns a power storage apparatus shared in a power distribution network 51. A consumer B 30 owns a power generation apparatus (solar panel 31) and a power storage apparatus 33, and means a consumer that owns a sharable power storage apparatus in the power distribution network 51. The consumer C 40 is connected to the power distribution network 51 as the same as the consumer A 20 and the consumer B 30, and means a consumer that does not own any power generation apparatus and power storage apparatus.

The power storage apparatuses 23 and 33 shared with other consumers may be switched at a predetermined time interval. A consumer is, for example, an individual, an enterprise or a group, etc. that make a contract with an electric power company and uses electric power supplied through a system 50 (refer to FIG. 1) via the power distribution network 51 by the electric power company, and includes, for example, an ordinary home (single-family house, apartment house), an enterprise (office, factory, facility, etc.), a local government and a state institution, etc. Consumers include a consumer that generates electric power by private power generation or realizes a ZEB (Zero Power Building).

Also, in the following embodiment, the system 50 (refer to FIG. 1) means an electric power system that supplies electric power supplied by the electric power company to each consumer via the power distribution network 51. In the following embodiment, smart meters 27, 37 and 47 (refer to FIG. 1) mean measurement devices that are disposed in each consumer, and measure the generated electricity amount, the stored electricity amount and the consumed electricity amount, and transmit the measurement result to the electric power company, etc. by using a communication function. By disposing the smart meters 27, 37 and 47, the electric power company can accurately grasp the real-time electric power status at each of the consumers A 20, B 30 and C 40, and can automate the meter reading work performed in every predetermined period.

In the following embodiment, loads 24, 34 and 44 (refer to FIG. 1) mean power consuming elements such as an air conditioner, a refrigerator, a microwave oven, an IH cooking heater and a television in the case where a consumer is an ordinary home, for example. In the case where a consumer is an enterprise (factory, etc.), for example, the loads 24, 34 and 44 mean power consuming elements such as various facilities disposed inside the factory and an air-conditioning facility. In the following embodiments, EMSs (Power Management Systems) 26, 36 (refer to FIG. 1) mean systems disposed in each of the consumers A 20 and B 30 to reduce the consumed electric power amount at the consumers A 20 and B 30.

First Embodiment

A power storage management system 10 according to the first embodiment is a system that manages the deterioration status of a shared power storage apparatus used by a plurality of consumers connected to a power distribution network supplying electric power. Specifically, as shown in FIG. 1, the power storage management system 10 is disposed so that the power storage apparatus 23 owned by the consumer A 20 is not excessively deteriorated by an inappropriate usage when the power storage apparatus 23 is shared in the power distribution network 51 in the available state for the customers B 30 and C 40. The solid lines shown inside each of the consumers A 20, B 30 and C 40 in FIG. 1 indicate the flow of information such as a data, and dashed lines indicate the flow of electricity. The configuration of the power storage management system 10 is described later.

[Consumer A]

In this embodiment, as shown in FIG. 1, the consumer A 20 is connected to the system 50 which supplies electric power supplied by the electric power company. The consumer A 20 is connected to the system 50 via the power distribution network 51 which the consumers B 30 and C 40 described later are also connected.

The consumer A 20 determines whether the charge/discharge control transmitted from the consumer C 40, etc. is an appropriate usage or not in the power storage management system 10 disposed in the power storage apparatus 23, which is described later, when the power storage apparatus 23 is shared with the consumer C 40. Then, for the consumer C 40, etc. which uses the power storage apparatus 23 in an inappropriate manner that accelerates deterioration, the consumer A 20 takes measures such as restricting usage of the power storage apparatus 23 and setting such a consumer as a billing target.

As shown in FIG. 1, the consumer A 20 has a solar panel (power generation apparatus) 21, a power conditioning system (PCS) for solar power generation 22, an electric power sensor for generated power 22a, a power storage apparatus (battery) 23, an electric power sensor for stored power 23a, a load 24, an electric power sensor for load 24a, a distribution board 25, an EMS (Energy Management System) 26 and a smart meter 27. The solar panel 21 is an apparatus that generates electricity by utilizing a photovoltaic effect using the light energy of the solar light, and disposed on the roof, etc. of the consumer A 20. The generated power amount of the solar panel 21 can be predicted based on information related to the sunshine duration of the weather forecast.

As shown in FIG. 1, the power conditioning system (PCS) for solar power generation 22 is connected to the solar panel 21, and converts a direct current generated by the solar panel 21 to an alternating current. As shown in FIG. 1, the electric power sensor for generated power 22a is connected to the power conditioning system for solar power generation 22, and measures the amount of power generated by the solar panel 21. Then, the electric power sensor for generated power 22a transmits the measurement result (generated power amount) to the EMS 26.

The power storage apparatus (battery) 23 is disposed for temporarily storing surplus electric power left unconsumed by the load 24 out of the electric power generated by the solar panel 21. Thereby, it is possible to eliminate wasting generated power by storing surplus power in the power storage apparatus 23 even the consumed power amount by the load 24 is low during the daytime in which the solar panel 21 generates electricity.

In this embodiment, the power storage apparatus 23 is used as a power storage apparatus that is shared by the plurality of consumers A 20, B 30 and C 40 connected to the same power distribution network 51. The power storage management system 10 disposed in the power storage apparatus 23 is described in detail later. As shown in FIG. 1, the electric power sensor for stored power 23a is connected to the power storage apparatus 23, and measures the amount of power stored in the power storage apparatus 23. Then, the electric power sensor for stored power 23a transmits the measurement result (stored power amount) to the EMS 26.

As mentioned above, the load 24 is household electric appliances such as the air conditioner and the refrigerator in an ordinary home or the power consuming elements such as various facilities and the air-conditioning facility in a factory, etc., and consumes the electric power supplied by the system 50, the electric power generated by the solar panel 21 and the electric power stored in the power storage apparatus 23. As shown in FIG. 1, the electric power sensor for load 24a is connected to the load 24 and measures the power amount consumed by the load 24. Then, the electric power sensor for load 24a transmits the measurement result (consumed power amount) to the EMS 26.

As shown in FIG. 1, the distribution board 25 is connected to the electric power sensor for generated power 22a, the electric power sensor for stored power 23a, the electric power sensor for load 24a and the smart meter 27. The distribution board 25 supplies the electric power generated by the solar panel 21 and the electric power stored in the power storage apparatus 23 to the load 24. Moreover, the distribution board 25 supplies surplus power generated in a certain time period to the system 50 through the smart meter 27. Thereby, the consumer A 20 can sell the surplus electric power to the electric power company.

As mentioned above, the EMS (Energy Management System) 26 is an energy management system disposed for educing the consumed power amount at the consumer A 20, and connected to each of the sensors 22a, 23a and 24a, as shown in FIG. 1. The EMS 26 efficiently supplies the electric power generated by the solar panel 21 and the electric power stored in the power storage apparatus 23 to the load 24 by using a detection result received from each of the sensors 22a, 23a and 24a. Thereby, it is possible to suppress the consumption amount of electric power supplied by the system 50 and effectively reduce the power cost at the consumer A 20.

As mentioned above, the smart meter 27 measures the generated power amount of the solar panel 21, the stored power amount of the power storage apparatus 23 and the consumed power amount of the load 24 respectively owned by the consumer A 20. As shown in FIG. 1, the smart meter 27 is connected to each of the sensors 22a, 23a and 24a via the distribution board 25. Moreover, the smart meter 27 has a communication function. Thereby, the smart meter 27 receives the charge/discharge control signal for the power storage apparatus 23 shared in the power distribution network 51 from the other consumers B 30 and C 40.

[Consumer B]

In this embodiment, as shown in FIG. 1, the consumer B 30 is connected to the system 50 via the power distribution network 51, as the same as the consumer A 20. In this embodiment, the consumer B 30 owns a power storage apparatus 33 that is not described as a power storage apparatus shared with other consumers C 40, etc. However, the power storage apparatus 33 owned by the consumer B 30 may also be shared with other consumers, as the same as the power storage apparatus 23 owned by the consumer A 20.

As shown in FIG. 1, the consumer B 30 has a solar panel (power generation apparatus) 31, a power conditioning system (PCS) for solar power generation 32, an electric power sensor for generated power 32a, the power storage apparatus (battery) 33, an electric power sensor for stored power 33a, a load 34, an electric power sensor for load 34a, a distribution board 35, an EMS (Energy Management System) 36 and a smart meter 37. The solar panel 31 is an apparatus that generates electric power by utilizing a photovoltaic effect using the light energy of the solar light, and disposed on the roof, etc. of the consumer B 30. The generated power amount of the solar panel 31 can be predicted based on information related to the sunshine duration of the weather forecast.

As shown in FIG. 1, the power conditioning system (PCS) for solar power generation 32 is connected to the solar panel 31, and converts the direct current generated at the solar panel 21 to the alternating current. As shown in FIG. 1, the electric power sensor for generated power 32a is connected to the power conditioning system for solar power generation 32, and measures the amount of power generated by the solar panel 31. Then, the electric power sensor for generated power 32a transmits the measurement result (generated electricity amount) to the EMS 36.

The power storage apparatus 33 is disposed for temporarily storing surplus power left unconsumed by the load 34 out of the power generated by the solar panel 21. Thereby, it is possible to eliminate wasting generated power by storing surplus power in the power storage apparatus 33 even the consumed power amount by the load 34 is low during the daytime in which the solar panel 31 generates electricity.

As shown in FIG. 1, the electric power sensor for stored power 33a is connected to the power storage apparatus 33, and measures the electric power amount stored in the power storage apparatus 33. Then, the electric power sensor for stored power 33a transmits the measurement result (stored power amount) to the EMS 36. As mentioned above, the load 34 is household electric appliances such as the air conditioner and the refrigerator in an ordinary home or the power consuming elements such as various facilities and the air-conditioning facility in a factory, etc., and consumes the electric power supplied by the system 50, the electric power generated by the solar panel 31 and the electric power stored in the power storage apparatus 33.

As shown in FIG. 1, the electric power sensor for load 34a is connected to the load 34, and measures the electric power amount consumed by the load 34. Then, the electric power sensor for load 34a transmits the measurement result (consumed power amount) to the EMS 36. As shown in FIG. 1, the distribution board 35 is connected to the electric power sensor for generated power 32a, the electric power sensor for stored power 33a, the electric power sensor for load 34a and the smart meter 37. The distribution board 35 supplies the electric power generated by the solar panel 31 and the electric power stored in the power storage apparatus 33 to the load 34. Moreover, the distribution board 35 supplies surplus power generated in a certain time period to the system 50 though the smart meter 37. Thereby, the consumer B 30 can sell the surplus power to the electric power company.

As mentioned above, the EMS (Energy Management System) 36 is an energy management system disposed for reducing the consumed power amount at the consumer B 30, and connected to each of the sensors 32a, 33a and 34a, as shown in FIG. 1. The EMS 36 efficiently supplies the electric power generated by the solar panel 31 and the electric power stored in the power storage apparatus 33 to the load 34 by using detection result received from each of the sensors 32a, 33a and 34a. Thereby, it is possible to suppress the consumption amount of electric power supplied by the system 50 and effectively reduce the power cost at the consumer B 30.

As mentioned above, the smart meter 37 measures the generated power amount of the solar panel 31, the stored power amount of the power storage apparatus 33 and the consumed power amount of the load 34 respectively owned by the consumer B 30. As shown in FIG. 1, the smart meter 37 is connected to each of the sensors 32a, 33a and 34a via the distribution board 35. Moreover, the smart meter 37 has a communication function.

[Consumer C]

In this embodiment, as shown in FIG. 1, the consumer C 40 is connected to the system 50 via the same power distribution network 51 to which the consumers A 20 and B 30 are connected. The consumer C 40 does not own any power generation apparatus or power storage apparatus, which is different from the consumers A 20 and B 30. Therefore, the consumer C 40 transmits the charge/discharge control signal to the power storage apparatus 23 for using electric power stored in the shared power storage apparatus 23 during a time period in which the price of electric power supplied from the system 50 is expensive, for example. As shown in FIG. 1, the consumer C 40 includes a load 44, an electric power sensor for load 44a, a distribution board 45 and a smart meter 47.

As mentioned above, the smart meter 47 measures the electric power amount supplied by other consumers A 20, etc. or the consumed power amount of the load 44. As shown in FIG. 1, the smart meter 47 is connected to the load 47 via the distribution board 45. Moreover, the smart meter 37 has a communication function. Thereby, the smart meter 47 can transmit the charge/discharge control signal to the power storage apparatus 23 owned by the consumer A 20 and shared in the power distribution network 51.

[Configuration of Power Storage Management System 10]

Figure 2:
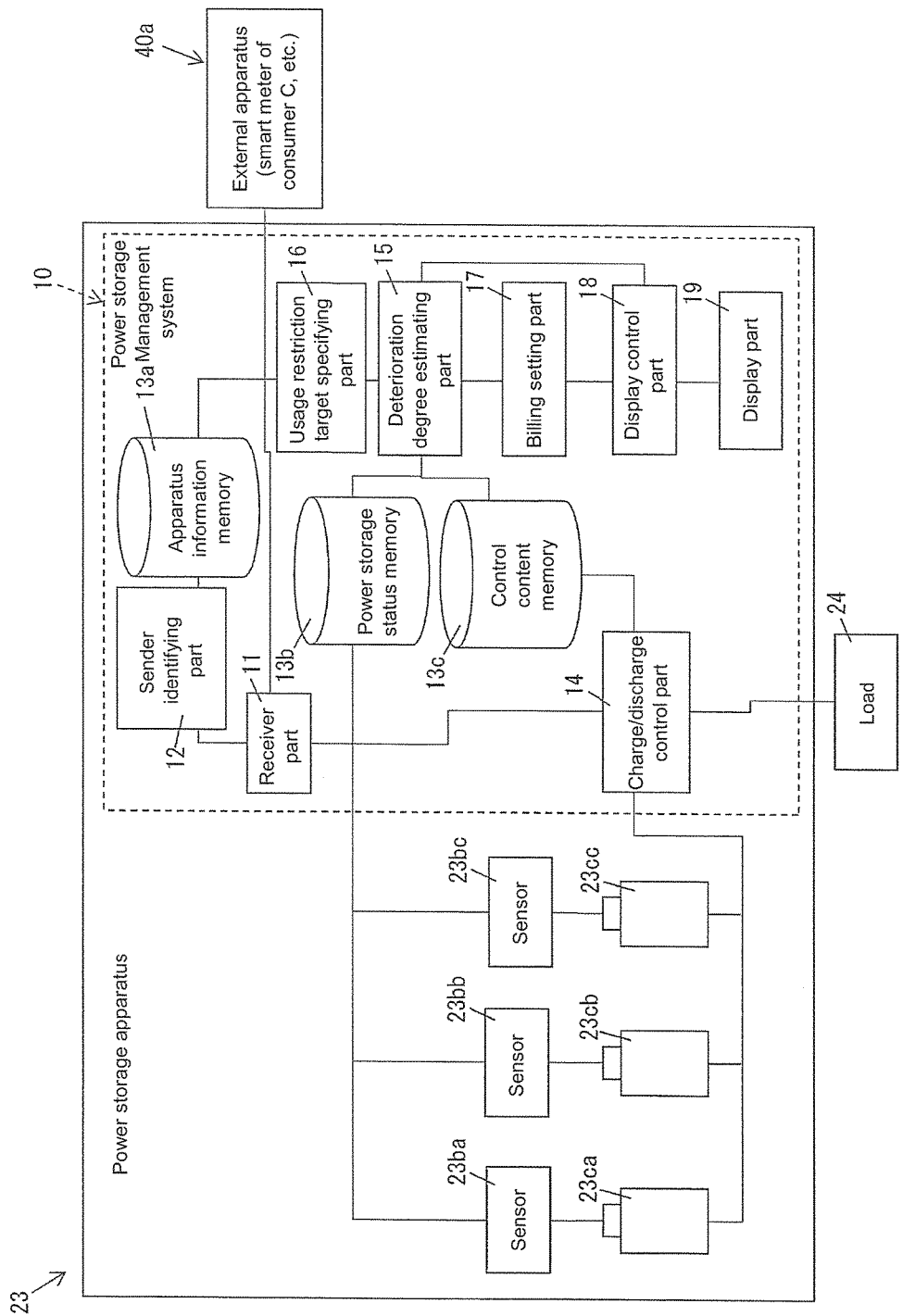
FIG. 2 is a block diagram illustrating the configuration of the power storage management system configured in the power storage apparatus owned by the consumer A in FIG. 1.

As shown in FIG. 2, the power storage management system 10 according to this embodiment is disposed in the power storage apparatus 23 shared by the plurality of consumers A 20, B 30 and C 40 in the power distribution network 51. The power storage management system 10 receives a control signal for charging or discharging the shared power storage apparatus 23 from an external apparatus 40a (for example, the smart meter 47 owned by the consumer C 40, etc.).

More specifically, as shown in FIG. 2, the power storage management system 10 includes a receiver part 11, a sender identifying part 12, an apparatus information memory 13a, a power storage status memory 13b, a control content memory 13c, a charge/discharge controlling part 14, a deterioration degree estimating part 15, a usage restriction target specifying part 16, a billing setting part 17, a display controlling part 18 and a display part 19. The receiver part 11 receives the charge/discharge control signal which is transmitted from the consumer C 40 (user) via the smart meter 27 and 47. In this embodiment, the charge/discharge control signal received by the receiver part 11 is a signal for using (charging or discharging) the power storage apparatus 23 shared by the plurality of consumers A 20, B 30 and C 40 in the power distribution network 51.

The sender identifying part 12 identifies the sender of the charge/discharge control signal, which is the apparatus (or user) which transmitted the signal for using the power storage apparatus 23, based on information related to the sender included in the charge/discharge control signal received by the receiver part 11. As shown in FIG. 3, the apparatus identified here is identified with an ID such as the sender apparatus ID0001. The sender apparatus is identified based on information correlating IDs and apparatus names that are stored in the apparatus information memory 13a in advance.

The apparatus information memory 13a stores information related to the sender apparatus of the charge/discharge control signal identified by the sender identifying part 12. In this embodiment, the smart meter 47 owned by the consumer C 40 or the consumer C 40 serving as the user is identified. The power storage status memory 13b stores information related to the status change of the power storage apparatus to which the charge/discharge control is performed according to the charge/discharge control signal received by the receiver part 11. The status change of the power storage apparatus 23 to which a charge/discharge control is performed includes the change in the full charge capacity, the change in the internal resistance, the change in the battery temperature, etc.

As shown in FIG. 2, the status change of the power storage apparatus 23 is detected by sensors 23ba, 23bb and 23bc respectively disposed in the cells 23ca, 23cb and 23cc. The sensors 23ba, 23bb and 23bc are, for example, at least one of a current sensor, a voltage sensor and a temperature sensor, for measuring the current value, the voltage value, the temperature, etc. of the cells 23ca, 23cb and 23cc constituting the power storage apparatus 23.

The control content memory 13c stores information related to the control contents of the charge/discharge control according to the charge/discharge control signal received by the receiver part 11. As shown in FIG. 3, the control contents include a command, parameters, etc. of the charge/discharge control. Specifically, as shown in FIG. 3, the sender apparatus ID indicating the apparatus which transmitted the charge/discharge control signal, the receiver apparatus ID indicating the apparatus which received the charge/discharge control signal, and the command and the parameters indicating the control contents are stored in the control content memory 13c.

The command indicating the control contents includes charging (ChargingCurrent) and discharging (DischargingCurrent). The parameters include information related to the current value and the duration of the charging or discharging. Also, the control content memory 13c stores the causal relationship information correlating the sender apparatus and the deterioration degree of the power storage apparatus due to the charge/discharge control performed according to the control signal transmitted from the sender apparatus by using the apparatus information identified by the sender identifying part 12 and the deterioration degree of the power storage apparatus 23 estimated by the deterioration degree estimating part 15.

The charge/discharge controlling part 14 performs the discharge control or the charge control of the power storage apparatus 23 (cells 23ca, 23cb and 23cc) according to the charge/discharge control signal received by the receiver part 11. The deterioration degree estimating part 15 estimates the deterioration degree of the power storage apparatus in the case where charging or discharging of the power storage apparatus 23 is performed according to the charge/discharge control signal received by the receiver part 11.

Specifically, the deterioration degree of the power storage apparatus 23 is estimated by measuring the current value, the voltage value, the temperature, etc. of the cells 23ca, 23cb and 23cc constituting the power storage apparatus 23 by using the sensor 23ba, 23bb and 23bc. In this embodiment, the estimation of the deterioration degree of the power storage apparatus 23 is performed by estimating the decreased amount of the full charge capacity of the power storage apparatus 23 by using the current value, the voltage value, the temperature, etc. of the cells 23ca, 23cb and 23cc constituting the power storage apparatus 23 measured by the sensor 23ba, 23bb and 23bc.

Figure 4:
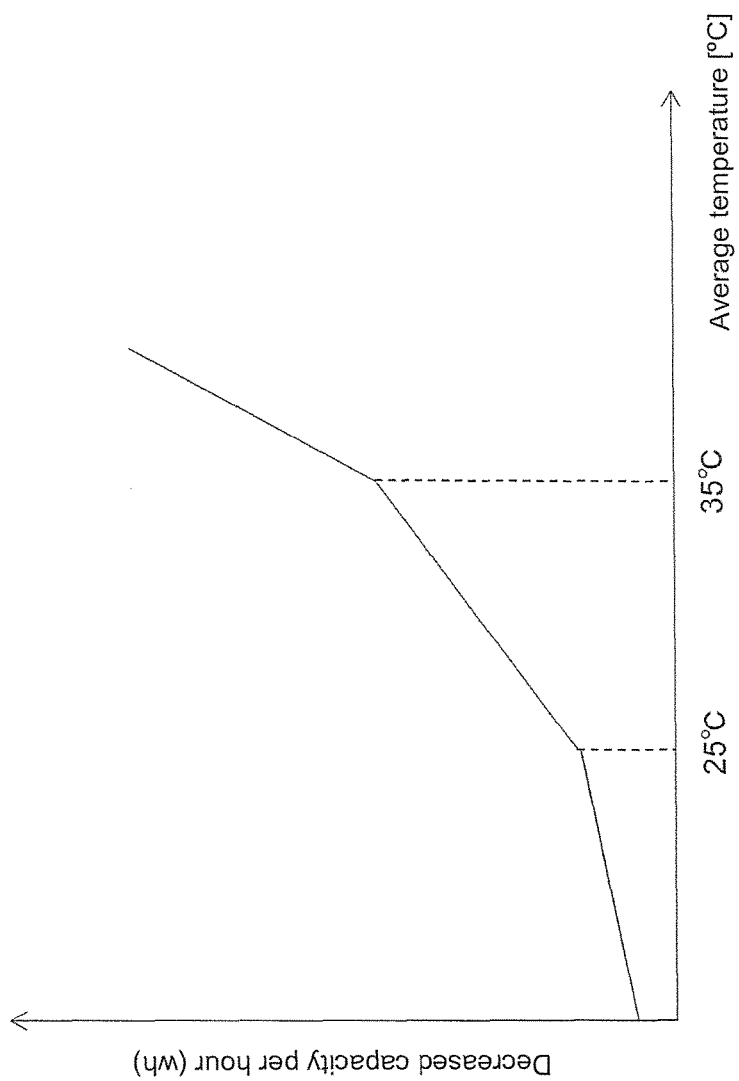
FIG. 4 is a graph illustrating the relationship between the temperature rise and decline in the full charge capacity of the power storage apparatus associated with charging or discharging.

Here, it is known that the full charge capacity of a power storage apparatus 23 is strongly related to temperature. Therefore, in this embodiment, the temperature change of the power storage apparatus 23, which rises as a result of the charge/discharge control according to the received charge/discharge control signal, is detected, and the decreased amount of the full charge capacity corresponding to the temperature changed is estimated as the deterioration degree Specifically, as shown in FIG. 4, when the average temperature of the power storage apparatus 23 rises, the decreased capacity of the power storage apparatus 23 per hour increases. That is, the capacity of the power storage apparatus 23 decreases as the temperature rises.

For example, it is assumed that the temperature inside the apparatus rises from 30° C. to 33° C. when the user uses the power storage apparatus 23 in a normal way (charging or discharging). In this case, if the average temperature of the cells 23ca, 23cb and 23cc constituting the power storage apparatus 23 rises to 37° C. as a result of the charge/discharge control received by the receiver part 11, it is understood that there is an extra 4° C. in the temperature rise because of the usage according to the charge/discharge control signal.

The data related to the temperature rise of the power storage apparatus 23 under the normal usage may be stored in the power storage status memory 13b, etc. in advance. The power storage management system 10 according to this embodiment considers an extra temperature rise resulted from an inappropriate usage such as rapid charging and large-capacity discharging as an inappropriate usage that accelerates deterioration of the power storage apparatus 23, and estimates the deterioration degree corresponding to the extra temperature rise.

Here, the temperature of the cells 23ca, 23cb and 23cc at the time the charging or discharging by the owner of the power storage apparatus or the charging or discharging instructed other than the external apparatus is performed is stored in the power storage status memory 13b. In the case where there exists no influence inside the power storage apparatus 23 from the outside temperature from the start to the end of charging or discharging, it is assumed that the temperature rise due to heat generation of the charged or discharged cells 23ca, 23cb and 23cc is the main cause of the temperature rise of the cells 23ca, 23cb and 23cc.

Thus, the heating value of the cells 23ca, 23cb and 23cc at the time of charging or discharging is calculated using the relative equation (1) shown below.

$$\text{Heating Value (W)} = \text{Current (A)} \times \text{Current (A)} \times \text{Internal Resistance } (\Omega) \tag{1}$$

Then, the temperature rise due to heat generation is estimated from the surface area and the heat transfer coefficient of the cells 23ca, 23cb and 23cc, using the relative equation (2) shown below.

$$\text{Temperature Rise (K)} = \text{Heat Value (W)} / (\text{Heat Transfer Coefficient (W/m2·K)} * \text{Surface Area (m2)}) \tag{2}$$

Figure 5:
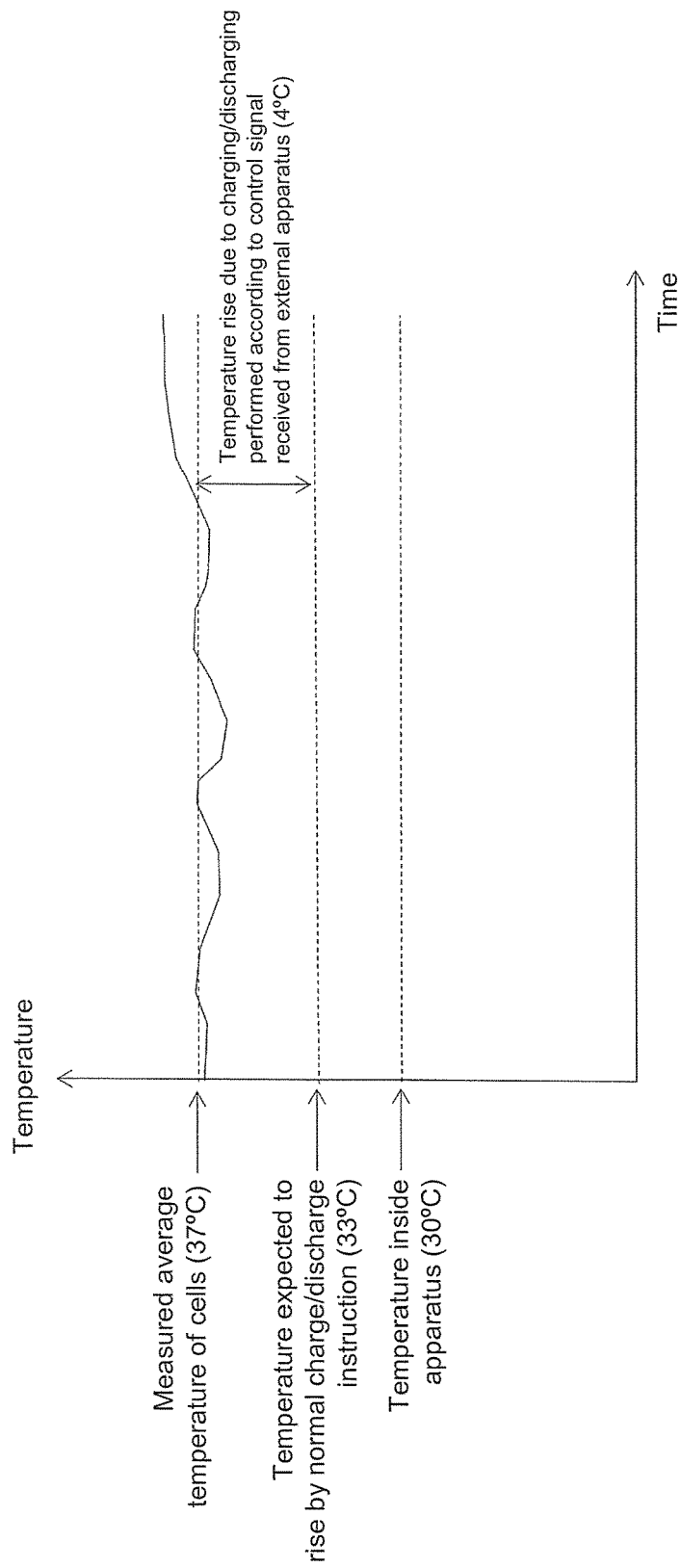
FIG. 5 is a graph illustrating the relationship of the surface temperature of the power storage apparatus detected by a sensor in FIG. 2, the temperature of the power storage apparatus which is estimated to rise because of charging or discharging performed by the owner of the power storage apparatus or performed based on instructions other than the instructions from an external apparatus, the temperature of the power storage apparatus before charging or discharging, and time.

The extra temperature rise (4° C.) from the temperature under the normal operation evaluated from the relative equation (2) is illustrated as FIG. 5. The relationship of decline in the full charge capacity associated with the deterioration of the power storage apparatus 23 due to the temperature rise from 33° C. to 37° C. is illustrated as the graph in FIG. 6. Thereby, the deterioration degree of the power storage apparatus 23 resulted from the usage according to the received charge/discharge control signal can be estimated.

Thus, in the graph shown in FIG. 5, the difference of 4° C. between the temperature 33° C. under the normal usage and the temperature 37° C. of the cells 23ca, 23cb and 23cc measured by the sensors 23ba, 23bb and 23bc is detected as the extra temperature rise. Then, the deterioration degree estimating part 15 calculates the decreased capacity per hour corresponding to the difference of 4° C. between the average temperature 33° C. under the normal operation and the average temperature 37° C. risen by the charge/discharge control according to the charge/discharge control signal received by the receiver part 11 by using the graph shown in FIG. 6.

Figure 6:
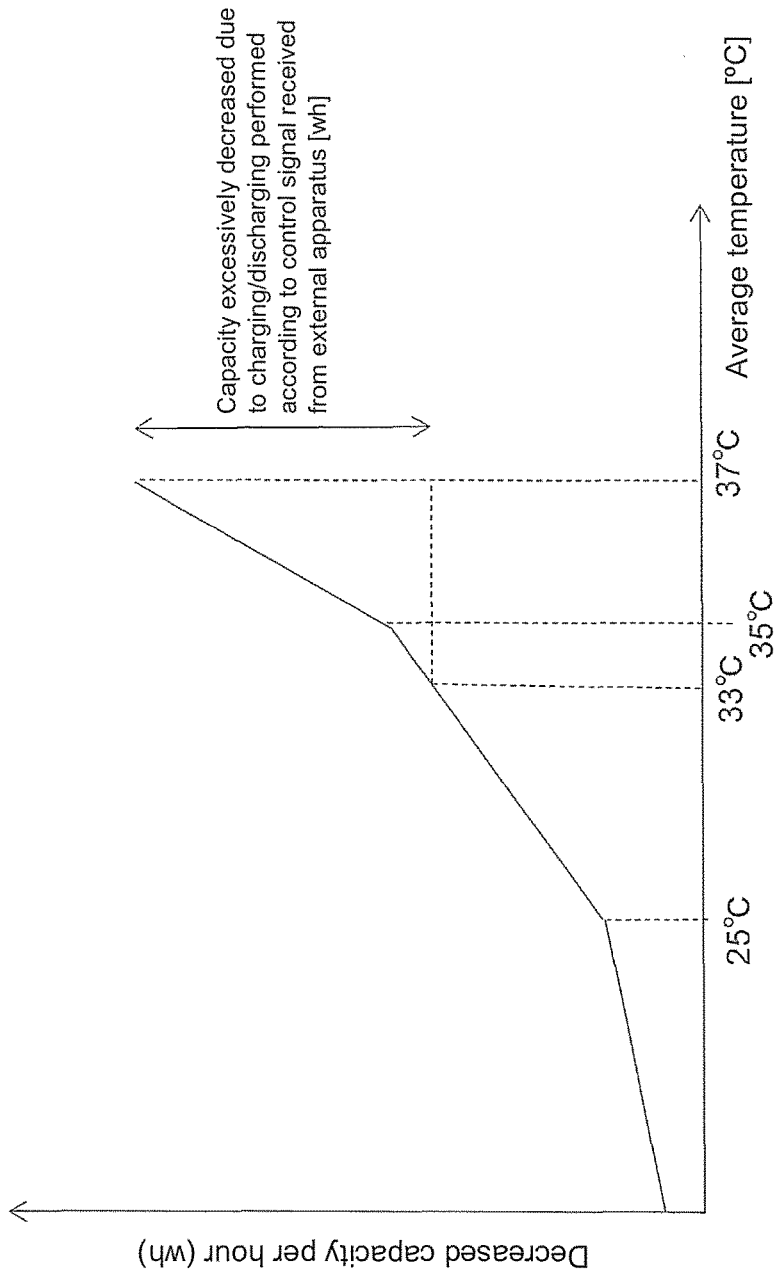
FIG. 6 is a graph illustrating the relationship between the temperature which additionally rises due to the charging or discharging performed according to the charge/discharge control signal received from an external apparatus and the decreased amount of the full charge capacity corresponding to it.

The graph indicating the relationship between the average temperature of the power storage apparatus 23 and the decreased capacity per hour shown in FIG. 6 may also be stored in the power storage status memory 13b, etc. Thereby, the deterioration degree estimating part 15 can estimate the deterioration degree of the power storage apparatus 23 by using an indicator that is decline in the full charge capacity by evaluating the decreased capacity per hour corresponding to the extra temperature rise compared to the temperature rise under the normal usage.

When the deterioration degree of the power storage apparatus 23 estimated by the deterioration degree estimating part 15 is determined to exceed a predetermined threshold, the usage restriction target specifying part 16 specifies information related to the apparatus or the user which is the sender of the charge/discharge control signal instructing the usage which accelerates deterioration. Then, the usage restriction target specifying part 16 stores the information of the sender apparatus, etc. in the apparatus information memory 13a for restricting the usage from the sender apparatus or the user from the next time.

Specifically, as shown in FIG. 7, information related to the consumers B, C and D as the user presumed to accelerate deterioration and their usage (control contents) along with the sender apparatus ID is specified. Then, the information is stored in the apparatus information memory 13a so that, for example, the usage from the user (consumer C) corresponding to the controlling apparatus ID of ID015 is restricted. Thereby, it is possible to avoid progress of deterioration of the shared power storage apparatus 23 by restricting the usage from the next time to the apparatus or the user (consumer C in FIG. 7) uses the shared power storage apparatus 23 in an inappropriate manner which accelerates deterioration.

The billing setting part 17 sets a billing amount corresponding to the deterioration degree to the apparatus or the user which is the sender of the charge/discharge control signal instructing the usage which accelerates deterioration of the power storage apparatus 23. Specifically, as shown in FIG. 7, the billing amount corresponding to the controlling apparatus ID, the user name (consumer B, C, D, etc.), or the usage (control contents) is set. The display controlling part 18 displays information such as the estimation result from the deterioration degree estimating part 15, the sender apparatus which is the target of the usage restriction, the user, or the usage (control contents) on the display part 19.

The display part 19 is, for example, a liquid crystal display panel, etc. and disposed in the shared power storage apparatus 23 owned by the consumer A 20. The display part 10 is controlled by the display controlling part 18 so as to display information such as the estimation result from the deterioration degree estimating part 15, the sender apparatus or the user which is the target of the usage restriction, or the usage (control contents).

[Power Storage Management Method]

Figure 8:
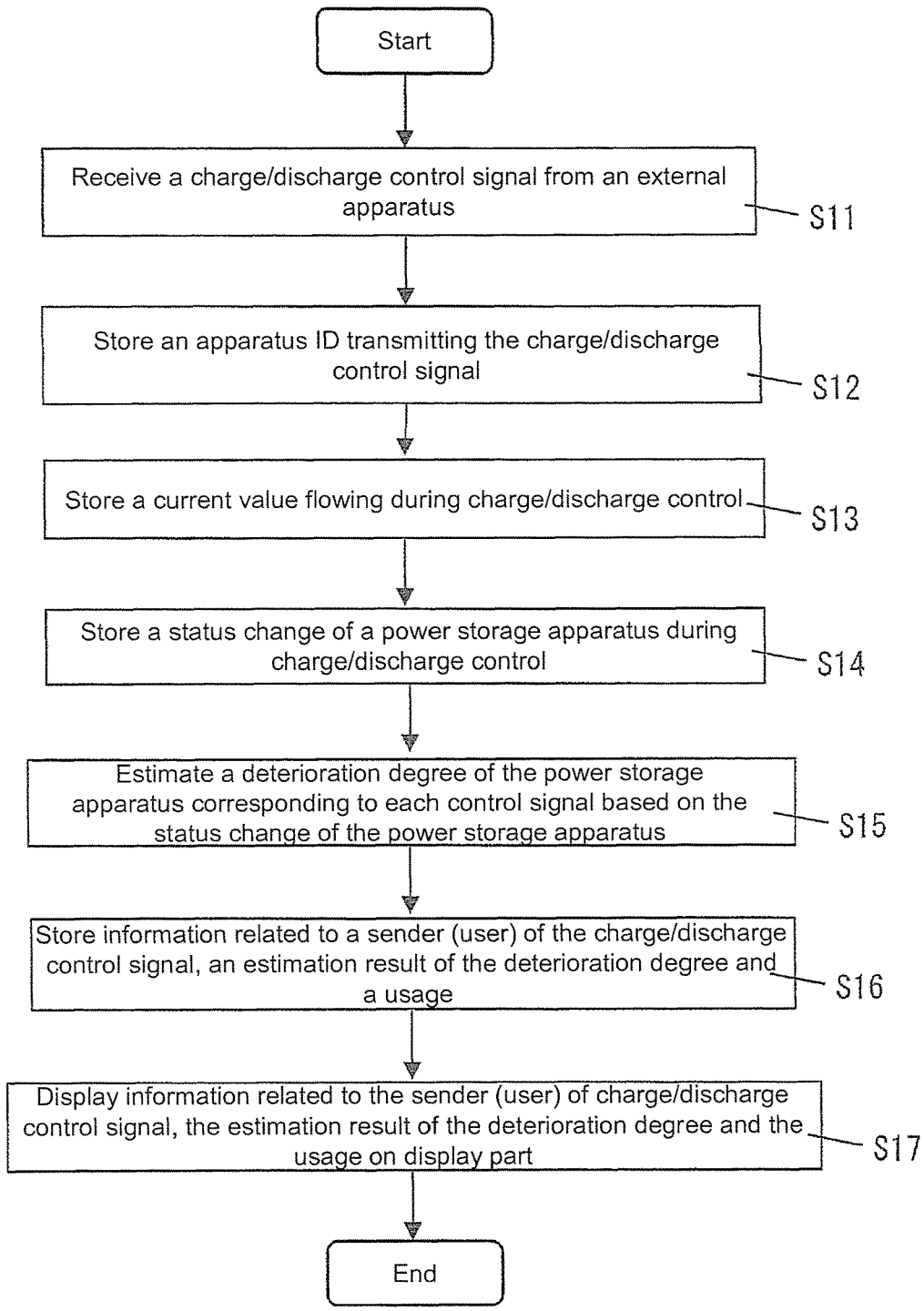
FIG. 8 is a flowchart illustrating the flow of the power storage management method according to the power storage management system of FIG. 2.

The power storage management system 10 according to this embodiment performs the power storage management method for the shared power storage apparatus 23 owned by the consumer A 20 by using the abovementioned configuration according to the flowchart shown in FIG. 8. In Step S11, the charge/discharge control signal for using the power storage apparatus 23 transmitted from the external device (smart meter 47 of the consumer C 40, for example) is received by the receiver part 11 of the power storage management system 10 disposed in the power storage apparatus 23 of the consumer A 20. Next, in Step S12, the sender apparatus is identified by the sender identifying part 12 of the power storage management system 10 based on the information of the sender apparatus (apparatus ID, etc.) included in the charge/discharge control signal received by the receiver part 11, and such information is stored in the apparatus information memory 13a.

Next, in Step S13, the current value input to or output from the power storage apparatus 23 from or to a charging/discharging apparatus (not depicted) when the power storage apparatus 23 is used (charged or discharged) according to the charge/discharge control signal is stored in the control content memory 13c of the power storage management system 10. Next, in Step S14, the status change (current, voltage, temperature, full charge capacity, etc.) of the power storage apparatus 23 when the charge/discharge control of the power storage apparatus 23 is performed according to the charge/discharge control signal is stored in the power storage status memory 13b of the power storage management system 10.

Next, in Step S15, the deterioration degree is estimated based on the status change of the power storage apparatus 23 by the deterioration degree estimating part 15 of the power storage management system 10. Specifically, as mentioned above, the decreased capacity corresponding to the temperature which is risen from the temperature under the normal usage due to the usage according to the charge/discharge control signal is calculated, and the decreased amount of the full charge capacity of the power storage apparatus 23 is evaluated as the deterioration degree, as shown in FIG. 6.

Next, in Step S16, information related to the sender (external apparatus, user) of the charge/discharge control signal, the estimated deterioration degree of the power storage apparatus 23 and the usage (control contents) is stored in the apparatus information memory 13a of the power storage management system 10. Next, in Step S17, the display controlling part 18 of the power storage management system 10 controls the display part 19 to display the information related to the sender (external apparatus, user) of the charge/discharge control signal, the estimated deterioration degree of the power storage apparatus 23 and the usage (control contents).

Thereby, the consumer A 20 which is the owner of the power storage apparatus 23 shared in the power distribution network 51 can learn the deterioration information of the power storage apparatus 23 used by the plurality of consumers A 20, B 30 and C 40, including itself, by looking at the contents displayed on the display part 19 of the power storage apparatus 23. Also, the power storage management system 10 according to this embodiment specifies the inappropriate user who accelerates deterioration of the power storage apparatus 23 and sets the usage restriction by using the abovementioned configuration according to the flowchart shown in FIG. 9.

That is, in Step S21, whether the estimated value (estimation result) of the deterioration degree of the power storage apparatus 23 calculated by the deterioration degree estimating part 15 is greater than or equal to the predetermined threshold or not is determined. Here, if the estimated value is less than the threshold, it is determined not to be an inappropriate usage and the process completes. On the contrary, if the estimated value is greater than or equal to the threshold, the process proceeds to Step S22. Next, in Step S22, because the estimated value of the deterioration degree is determined to be greater than or equal to the threshold, the usage restriction target specifying part 16 specifies information such as the apparatus ID of the sender of the charge/discharge control signal instructing the inappropriate usage, the user name (consumer B, C, etc.) of the apparatus, and the contact information.

Next, in Step S23, the setting for restricting the usage from the apparatus ID and the user specified by the usage restriction target specifying part 16 is performed. Next, in Step S24, the apparatus and the user inappropriately using the power storage apparatus 23 and specified as the target of the usage restriction is displayed on the display part 19. Thereby, the consumer A 20 which is the owner of the power storage apparatus 23 shared in the power distribution network 51 can learn the information of the user, etc. inappropriately using the power storage apparatus 23 by looking at the contents displayed on the display part 19 of the power storage apparatus 23.

Figure 10:
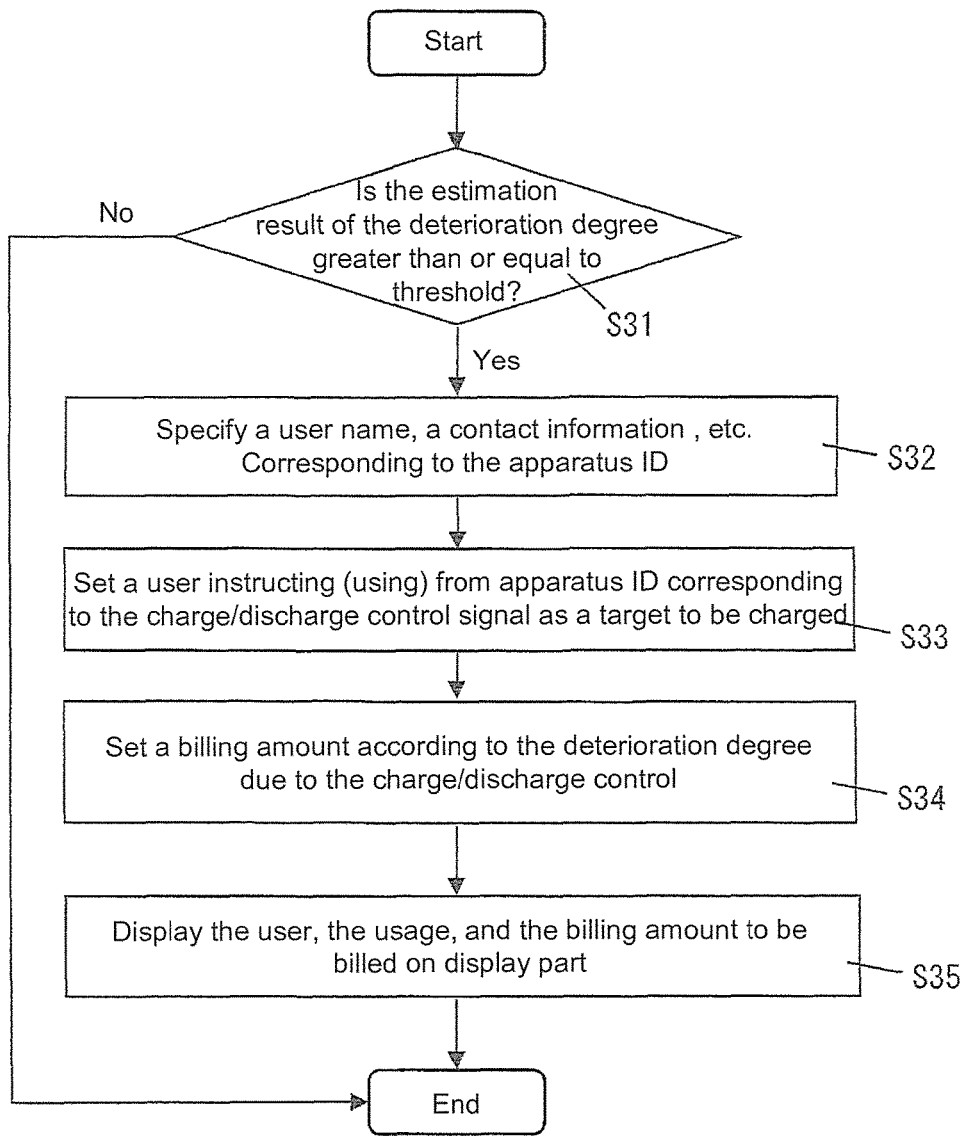
FIG. 10 is a flowchart illustrating the flow of operations when performing the billing setting to the billing target user in the power storage management system of FIG. 2.

Further, the power storage management system 10 according to this embodiment specifies the inappropriate user who accelerates deterioration of the power storage apparatus 23 according to the flowchart shown in FIG. 10, and sets the user as the billing target. That is, in Step S31, whether the estimated value (estimation result) of the deterioration degree of the power storage apparatus 23 calculated by the deterioration degree estimating part 15 is greater than or equal to a predetermined threshold or not is determined. Here, if the estimated value is less than the threshold, it is determined not to be an inappropriate usage and the process completes. On the contrary, if the estimated value is greater than or equal to the threshold, the process proceeds to Step S32, as the same as the abovementioned Step S21.

Next, in Step S32, because the estimated value of the deterioration degree is determined to be greater than or equal to the threshold, the usage restriction target specifying part 16 specifies information such as the apparatus ID of the sender of the charge/discharge control signal instructing the inappropriate usage, the user name (consumer B, C, etc.) of the apparatus and the contact information. Next, in Step S33, the apparatus or the user which instructed the inappropriate usage is set as the billing target for making the user compensate for the damage of deterioration acceleration of the power storage apparatus 23.

Next, in Step S34, the billing amount corresponding to the deterioration degree (decline in the full charge capacity, for example) is set to the user, etc. specified as the billing target by the billing setting part 17. Specifically, as shown in FIG. 7, two discharge current controls, which are the first usage (discharging 4 A for 200 minutes) and the second usage (discharging 10 A for 300 minutes), from the consumer C 40 of the controlling apparatus ID0015 are set as the billing targets.

Regarding the set billing amounts, as shown in FIG. 7, 5,000 Japanese yen is set to the first usage (discharging 4 A for 200 minutes). Then, to the second usage (discharging 10 A for 300 minutes), 15,000 Japanese yen is set because the load applied to the power storage apparatus 23 is higher and the deterioration degree is greater compared to the first usage. Next, in Step S35, the information of the billing target user, the usage (control contents), the billing amount, etc. are displayed on the display part 19.

Thereby, the consumer A 20 which is the user of the power storage apparatus 23 shared in the power distribution network 51 can confirm the billing information of the user who inappropriately uses the power storage apparatus 23 by looking at the contents displayed on the display part 19 of the power storage apparatus 23.

Other Embodiments

An embodiment of the disclosure is described above, but the present invention is not limited thereto, and various modifications may be made within the scope not deviating the gist of the present invention.

Figure 9:
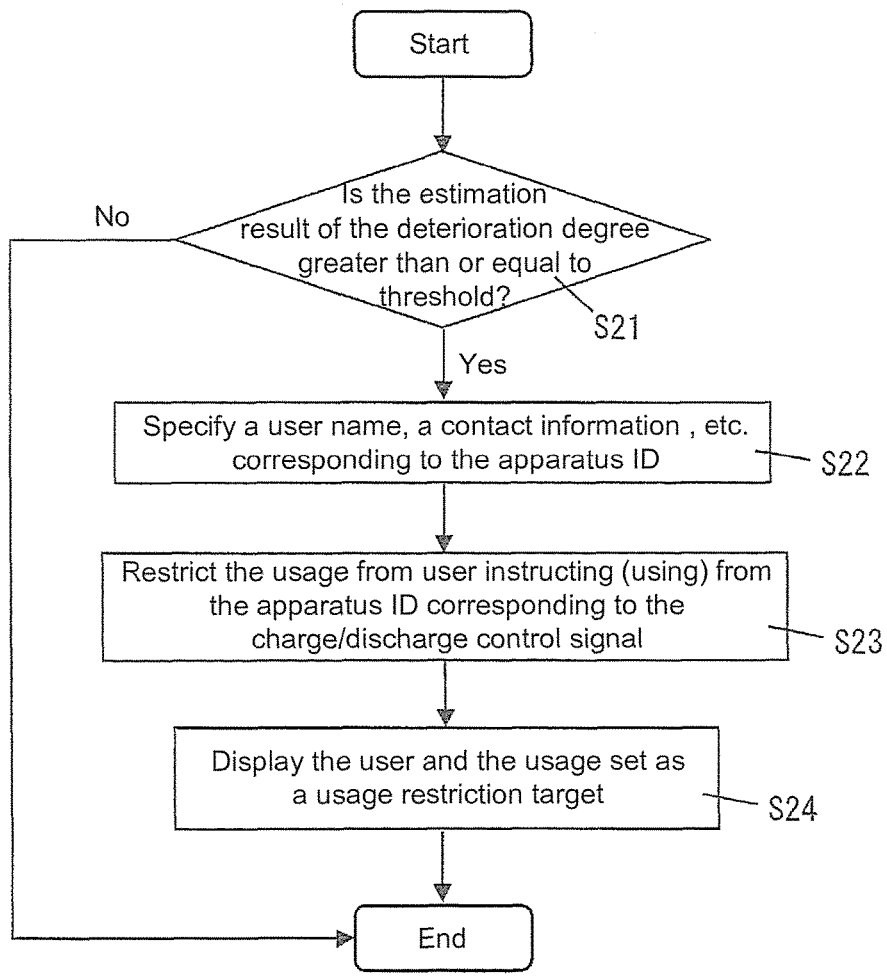
FIG. 9 is a flowchart illustrating the flow of operations when performing the usage restriction setting in the power storage management system of FIG. 2.

[A] In the aforementioned embodiment, the power storage management method according to the disclosure is described using an example in which the deterioration degree at the time of charging or discharging of the power storage apparatus is estimated according to the flowchart shown in FIGS. 8, 9 and 10, but the present invention is not limited thereto. The present invention may be realized as an electricity storage management program that makes a computer operate the power storage management method according to the flowchart shown in FIGS. 8, 9 and 10. Also, the present invention may be realized as a storage medium storing the power storage management program.

[B] As shown in FIG. 1, the aforementioned embodiment describes an example that among the plurality of consumers mutually connected to each other via the power distribution network 51, the consumers A 20 and B 30 respectively own the power storage apparatuses 23 and 33, and the consumer C 40 does not own any power storage apparatus, but the present invention is not limited thereto.

Figure 11:
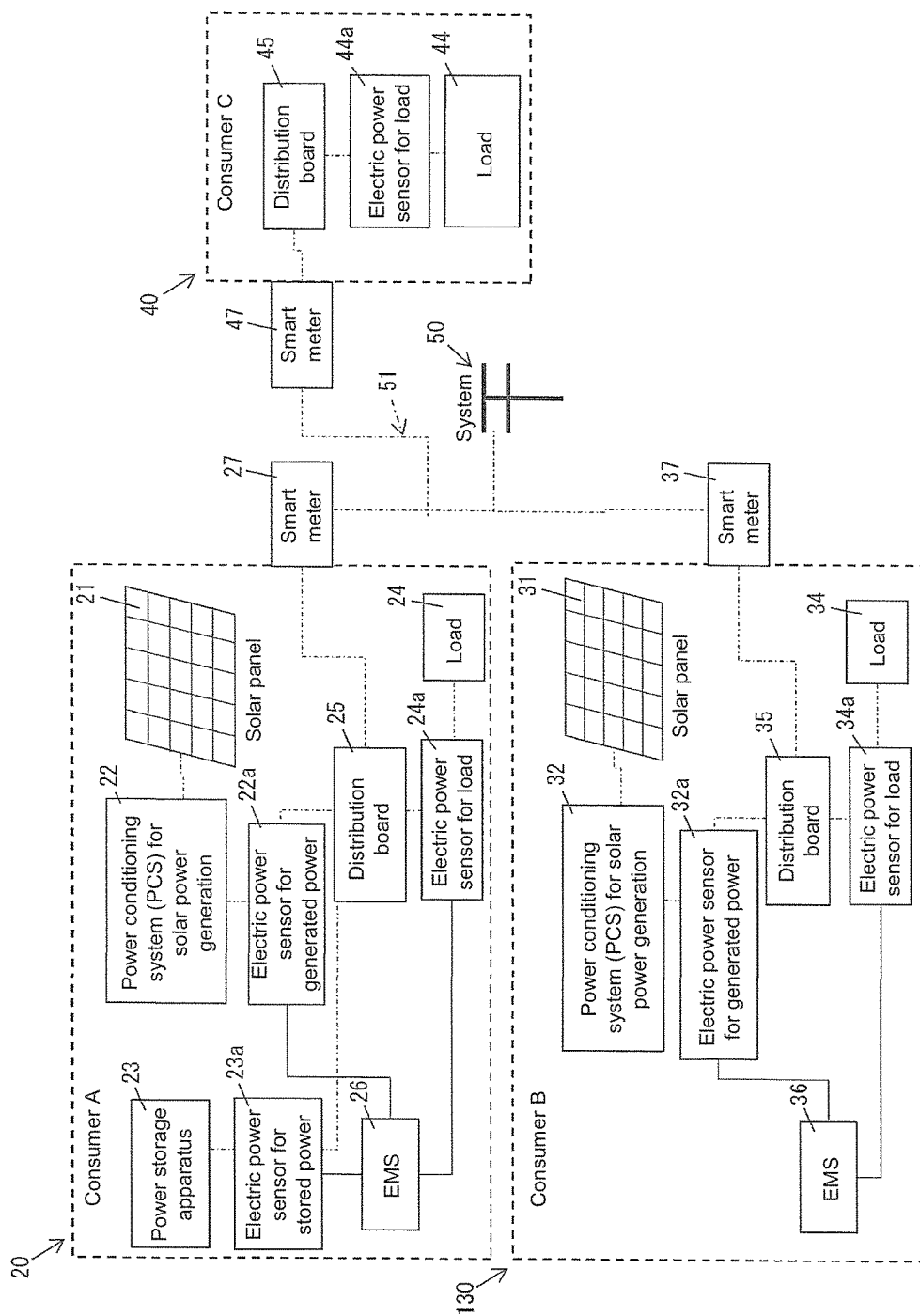
FIG. 11 is a block diagram illustrating a configuration in which a plurality of consumers including a consumer which owns the power storage apparatus including the power storage management system according to another embodiment of the disclosure are connected to a power distribution network.

For example, as shown in FIG. 11, a system of the disclosure may be one that only the consumer A 20 owns the power storage apparatus 23 among the plurality of consumers mutually connected to each other via the power distribution network 51, and a plurality of consumers B 130 and C 40 share the power storage apparatus 23. Also, the number of consumers connected to the power distribution network 51 is not limited to three as shown in FIG. 3, and may be greater than or equal to four, or may be two.

[C] The aforementioned embodiment describes an example that estimates the deterioration degree when the consumer C 40 which does not own facilities such as a power storage apparatus makes use of the power storage apparatus 23 owned by the consumer A 20 as a power storage apparatus shared in the power distribution network 51, but the present invention is not limited thereto.

For example, the deterioration degree may be estimated when the consumer B 30 which owns the power storage apparatus 33 makes use of the power storage apparatus 23 owned by the consumer A 20 as a power storage apparatus shared in the power distribution network 51 because of a failure, etc. of the power storage apparatus 33. On the contrary, the deterioration degree may be estimated when the consumer A 20 or the consumer C 40 makes use of the power storage apparatus 33 owned by the consumer B 30 as a power storage apparatus shared in the power distribution network 51. Also, the deterioration degree of each of the power storage apparatuses 23 and 33 may be estimated when the consumer C 40 makes use of the power storage apparatuses 23 and 33 respectively owned by the consumers A 20 and B 30 as a power storage apparatuses shared in the power distribution network 51.

[D] The aforementioned embodiment describes an example that the power storage management system 10 of the disclosure is disposed in the power storage apparatus 23 owned by the consumer A 20, but the present invention is not limited thereto. In the present invention, a power storage management system is not required to be disposed in a power storage apparatus. For example, a power storage management system may be disposed between a power storage apparatus and an external apparatus. In this case, the deterioration degree of the power storage apparatus may be estimated when the power storage apparatus receives a control signal transmitted from the external device to the power storage apparatus and performs charging or discharging according to the control signal.

[E] The aforementioned embodiment describes an example that the external apparatus 40a is an apparatus such as the smart meter 47 owned by the consumer C 40, etc., but the present invention is not limited thereto. For example, the external apparatus may be not only a smart meter owned by another consumer but also a power storage apparatus or a load (power consuming element), etc.

[F] The aforementioned embodiment describes an example that charging or discharging of the power storage apparatus 23 is performed according to the control signal received from the external apparatus 40a, but the present invention is not limited thereto. For example, the deterioration degree may be estimated when the power storage apparatus 23 receives the control signal input by the owner, which is the consumer A 20, and performs charging or discharging according to the control signal. In this case, the influence from the usage by the owner itself, the consumer A 20, of the power storage apparatus 23 to the deterioration of the power storage apparatus 23 may be detected.

[G] The aforementioned embodiment describes a configuration example that the apparatus information memory 13a, the power storage status memory 13b and control content memory 13c is disposed in the power storage apparatus 23 as the memory part, but the present invention is not limited thereto. For example, a single memory may be used to store the apparatus ID, the status of the power storage apparatus and the control contents.

[H] The aforementioned embodiment describes a configuration example that the power storage apparatus 23 includes the display part 19, but the present invention is not limited thereto.

For example, a display screen of an external device such as a screen of a PC (Personal Computer) may be used as the display part. In this case, the display of the PC screen, etc. may be controlled by the display controlling part 18 included in the power storage management system 10 or by transmitting display information to the display controlling part at the PC side.

The power storage management system according to the disclosure has an effect that it is possible to manage the deterioration status of the power storage apparatus by identifying users or apparatuses that use the power storage apparatus shared in a power distribution network in a manner that accelerates deterioration of the power storage apparatus. Therefore, the power storage management system can be widely applied to various systems in which a shared power storage apparatus is used.

What is claimed is:

1. A power storage management system for managing a deterioration degree of a power storage apparatus that is used by a plurality of consumers connected to a power distribution network supplying electric power, the power storage management system comprising:
    a receiver part, receiving a control signal giving a charge/discharge instruction to the power storage apparatus,
    a sender identifying part, identifying a sender apparatus that transmitted the control signal received by the receiver part,
    a memory part, storing an apparatus information related to the sender apparatus identified by the sender identifying part and an power storage status information related to a status change of the power storage apparatus caused by a charging or discharging performed according to the control signal transmitted from the sender apparatus, and
    a deterioration degree estimating part, estimating the deterioration degree of the power storage apparatus to which a charge/discharge control is performed according to the control signal transmitted from the sender apparatus based on the apparatus information and the power storage status information.

2. The power storage management system according to claim 1, wherein
    the memory part further stores a causal relationship information that correlates the sender apparatus and the deterioration degree of the power storage apparatus resulted from the charging or discharging performed according to the control signal transmitted from the sender apparatus based on the deterioration degree estimated by the deterioration degree estimating part and the apparatus information identified by the sender identifying part.

3. The power storage management system according to claim 1, wherein
    the power storage status information includes at least any one of a full charge capacity, an internal resistance and a temperature, of the power storage apparatus.

4. The power storage management system according to claim 3, wherein
    the power storage status information is obtained by using at least any one of current sensors, voltage sensors and temperature sensors, disposed in the power storage apparatus.

5. The power storage management system according to claim 2, further comprising
    a charge/discharge controlling part, performing the charge/discharge control of the power storage apparatus based on the control signal,
    wherein the charge/discharge controlling part determines whether to perform the charge/discharge control according to the control signal received from the receiver part or not, based on the causal relationship information stored in the memory part.

6. The power storage management system according to claim 5, further comprising
    a usage restriction target specifying part, specifying at least one of an information related to the control signal received from the receiver part and an information related to an owner of the sender apparatus if it is determined the charge/discharge control is not to be performed by the charge/discharge controlling part.

7. The power storage management system according to claim 2, further comprising a display controlling part, displaying at least one of an estimation result from the deterioration degree estimating part and the causal relationship information on a display part.

8. The power storage management system according to claim 2, further comprising
a billing setting part, setting an owner of the sender apparatus which transmitted the control signal as a billing target based on the causal relationship information.

9. A power storage apparatus, comprising:
the power storage management system according to claim 1 and cells that are charged or discharged according to the charge/discharge instruction.

10. A power storage management method for managing a deterioration degree of a power storage apparatus that is used by a plurality of consumers connected to a power distribution network supplying electric power, the power storage management method comprising
a receiving step, receiving a control signal giving a charge/discharge instruction to the power storage apparatus,
a sender identifying step, identifying a sender apparatus that transmitted the control signal received in the receiver step, and
a deterioration degree estimating step, estimating the deterioration degree of the power storage apparatus to which a charge/discharge control is performed according to the control signal transmitted from the sender apparatus, based on an apparatus information related to the sender apparatus and an power storage status information related to a status change of the power storage apparatus caused by a charging or discharging performed according to the control signal transmitted from the sender apparatus.

11. A power storage management program for performing a power storage management method on a computer to manage a deterioration degree of a power storage apparatus that is used by a plurality of consumers connected to a power distribution network supplying electric power, the power storage management method comprising
a receiving step, receiving a control signal giving a charge/discharge instruction to the power storage apparatus,
a sender identifying step, identifying a sender apparatus that transmitted the control signal received in the receiver step, and
a deterioration degree estimating step, estimating the deterioration degree of the power storage apparatus to which a charge/discharge control is performed according to the control signal transmitted from the sender apparatus, based on an apparatus information related to the sender apparatus and an power storage status information related to a status change of the power storage apparatus caused by a charging or discharging performed according to the control signal transmitted from the sender apparatus.

* * * * *